(12) United States Patent
Takeyama et al.

(10) Patent No.: US 9,286,960 B2
(45) Date of Patent: Mar. 15, 2016

(54) MEMORY SYSTEM AND ASSEMBLING METHOD OF MEMORY SYSTEM

(71) Applicant: Kabushiki Kaisha Toshiba, Minato-ku (JP)

(72) Inventors: Yoshikazu Takeyama, Fujisawa (JP); Yuji Nagai, Sagamihara (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 4 days.

(21) Appl. No.: 14/445,479

(22) Filed: Jul. 29, 2014

(65) Prior Publication Data
US 2015/0131397 A1 May 14, 2015

(30) Foreign Application Priority Data
Nov. 8, 2013 (JP) .................. 2013-232541

(51) Int. Cl.
*G11C 8/00* (2006.01)
*G11C 8/12* (2006.01)
*G11C 16/20* (2006.01)
*H01L 25/065* (2006.01)
*H01L 23/31* (2006.01)
*H01L 23/00* (2006.01)
*H01L 25/18* (2006.01)

(52) U.S. Cl.
CPC *G11C 8/12* (2013.01); *G11C 16/20* (2013.01); *H01L 23/3128* (2013.01); *H01L 24/06* (2013.01); *H01L 24/32* (2013.01); *H01L 24/48* (2013.01); *H01L 24/73* (2013.01); *H01L 25/0657* (2013.01); *H01L 25/18* (2013.01); *H01L 2224/04042* (2013.01); *H01L 2224/06135* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/06562* (2013.01); *H01L 2924/1443* (2013.01); *H01L 2924/15311* (2013.01)

(58) Field of Classification Search
CPC ...... G11C 8/12; G11C 16/20; H01L 25/0657; H01L 2224/04042; H01L 2224/06135; H01L 2224/32145
USPC .................... 365/230.03, 51, 52, 63
See application file for complete search history.

(56) References Cited

U.S. PATENT DOCUMENTS

| 7,061,105 | B2 * | 6/2006 | Masuda ................. B82Y 10/00 257/723 |
| 7,215,561 | B2 * | 5/2007 | Park .................... G06F 13/4234 365/230.03 |
| 7,466,577 | B2 * | 12/2008 | Sekiguchi ............... G11C 5/02 257/686 |
| 2013/0250643 | A1 | 9/2013 | Matsunaga | |

FOREIGN PATENT DOCUMENTS

JP  2013-200595  10/2013

* cited by examiner

*Primary Examiner* — Toan Le
(74) *Attorney, Agent, or Firm* — Oblon, McClelland, Maier & Neustadt, L.L.P.

(57) ABSTRACT

According to one embodiment, each memory chip included in a memory package includes a first storage unit that stores therein first information that is n-bit information and is a comparison target of a chip address, and is used for identifying its own memory chip, a second storage unit that stores therein second information for determining an effective bit of the n-bit first information, and a control unit that determines an effective bit of the n-bit first information and an effective bit of the chip address based on the second information.

14 Claims, 20 Drawing Sheets

FIG.8

| | input cycle | I/O7 | I/O6 | I/O5 | I/O4 | I/O3 | I/O2 | I/O1 | I/O0 |
|---|---|---|---|---|---|---|---|---|---|
| Add1 | 1 | A7 | A6 | A5 | A4 | A3 | A2 | A1 | A0 |
| | | A14-A0: column address | | | | | | | |
| Add2 | 2 | A15 | A14 | A13 | A12 | A11 | A10 | A9 | A8 |
| | | don't care | A14-A0: column address | | | | | | |
| Add3 | 3 | A23 | A22 | A21 | A20 | A19 | A18 | A17 | A16 |
| | | A23-A16: page address | | | | | | | |
| Add4 | 4 | A31 | A30 | A29 | A28 | A27 | A26 | A25 | A24 |
| | | A35-A25: block address | | | | | | | plane |
| Add5 | 5 | A39 | A38 | A37 | A36 | A35 | A34 | A33 | A32 |
| | | don't care | A38-A36: chip address | | | A35-A25: block address | | | |

MEMORY SYSTEM AND ASSEMBLING METHOD OF MEMORY SYSTEM

CROSS-REFERENCE TO RELATED APPLICATIONS

This application is based upon and claims the benefit of priority from Japanese Patent Application No. 2013-232541, filed on Nov. 8, 2013; the entire contents of which are incorporated herein by reference.

FIELD

Embodiments described herein relate generally to a memory system having a chip package including a plurality of semiconductor memory chips therein and an assembling method of the memory system.

BACKGROUND

To select one memory chip from a plurality of memory chips in a multi-chip package, a controller uses chip enables and chip addresses.

When the number of chip enable pins included in a multi-chip package increases, at the time of mounting the multi-chip package on a substrate, wiring of a plurality of chip enable pins on a side of the multi-chip package and a plurality of chip enable pins on a side of a controller that controls the multi-chip package becomes complicated. When a large capacity storage is to be realized, many multi-chip packages need to be mounted on the substrate. Therefore, the total number of chip enable pins of the respective packages increases and wiring on the substrate becomes more complicated. Furthermore, when the number of chip enable pins present on the side of the controller increases, the chip area of the controller also increases, resulting in the cost increase.

BRIEF DESCRIPTION OF THE DRAWINGS

FIG. 6 is a flowchart of an operation procedure of the memory chip when a power supply of the memory system according to a first embodiment is turned on;

FIG. 8 illustrates an example of an address signal input in five cycles;

FIG. 17 is a flowchart of an operation procedure of a memory chip when a power supply of a memory system according to a second embodiment is turned on;

FIG. 18 is a flowchart of an operation procedure of a controller when the power supply of the memory system according to the second embodiment is turned on;

DETAILED DESCRIPTION

In general, according to one embodiment, a memory system comprises a memory package and a controller. the memory package includes a plurality of memory chips, each of the memory chips including a non-volatile memory cell array. The controller is configured to select one memory chip from the memory package based on a chip enable and a chip address. Each of the memory chips includes a first storage unit configured to store therein first information that is n-bit information (n is an integer of 2 or more) compared to the chip address, the first information being used for identifying its own memory chip, a second storage unit configured to store therein second information for determining an effective bit of the n-bit first information, and a control unit configured to determine an effective bit of the n-bit first information and an effective bit of the chip address based on the second information.

Exemplary embodiments of a memory system and an assembling method of the memory system will be explained below in detail with reference to the accompanying drawings. The present invention is not limited to the following embodiments.

(First Embodiment)

Figure 1:
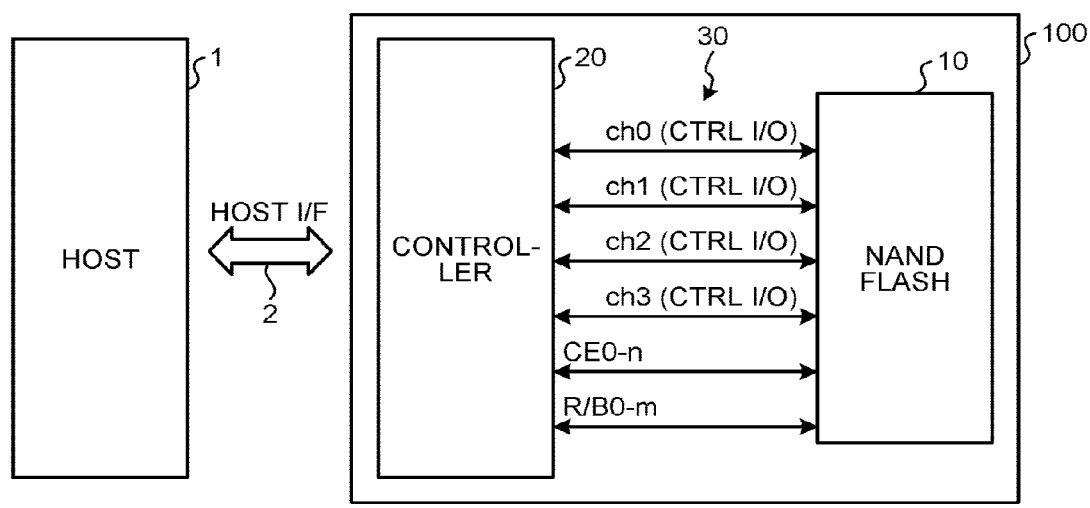
FIG. 1 is a block diagram of a configuration example of a memory system.

FIG. 1 illustrates a configuration example of a memory system 100. The memory system 100 is connected via a host interface 2 to a host device (hereinafter, "host") 1 and functions as an external storage device of the host 1. For example, the host 1 is a personal computer, a tablet, a smart phone, a mobile phone, an imaging device, or the like.

The memory system 100 includes a NAND flash 10 (hereinafter, "NAND") serving as a non-volatile semiconductor memory, a controller 20 that controls the NAND 10, and a NAND interface (hereinafter, "NAND I/F") 30 that connects the NAND 10 to the controller 20. A non-volatile memory is not limited to a non-volatile semiconductor memory such as the NAND flash 10, and it suffices that the non-volatile memory can be a data storable memory such as a ReRAM (Resistance Random Access Memory) and a FeRAM (Ferroelectric Random Access Memory).

The NAND I/F 30 includes control I/O (Ctrl I/O) signals of a plurality of channels (in this case, four channels ch0 to ch3), a plurality of chip enable signals /CE0 to /CEn, and a plurality of ready/busy signals (R/B0 to R/Bm). The Ctrl I/O signals include, as control signal lines, a command latch enable signal (CLE), an address latch enable signal (ALE), a write enable signal (/WE), a read enable signal (/RE), a write protect signal (/WP), a data strobe signal (DQS), and the like, and include, as commands, addresses, and data signal lines, I/O signal lines 100 to 107. While the I/O signal lines IO0 to IO7 are 8 bits, other bit numbers can be used. The memory system 100 is constituted by mounting the NAND 10 and the controller 20 on a printed circuit board (PCB).

The NAND 10 is constituted by a plurality of memory chips. Each memory chip has a memory cell array having a plurality of memory cells arranged in a matrix therein. Each memory cell can store multiple values therein. Each memory chip is constituted by arranging a plurality of physical blocks each of which serves as a unit of data erasing. In the NAND 10, data writing and data reading are performed for each physical page. The physical block is constituted by a plurality of physical pages.

The controller 20 executes control such as reading from and writing to the NAND 10 according to commands transmitted from the host 1.

Figure 2:
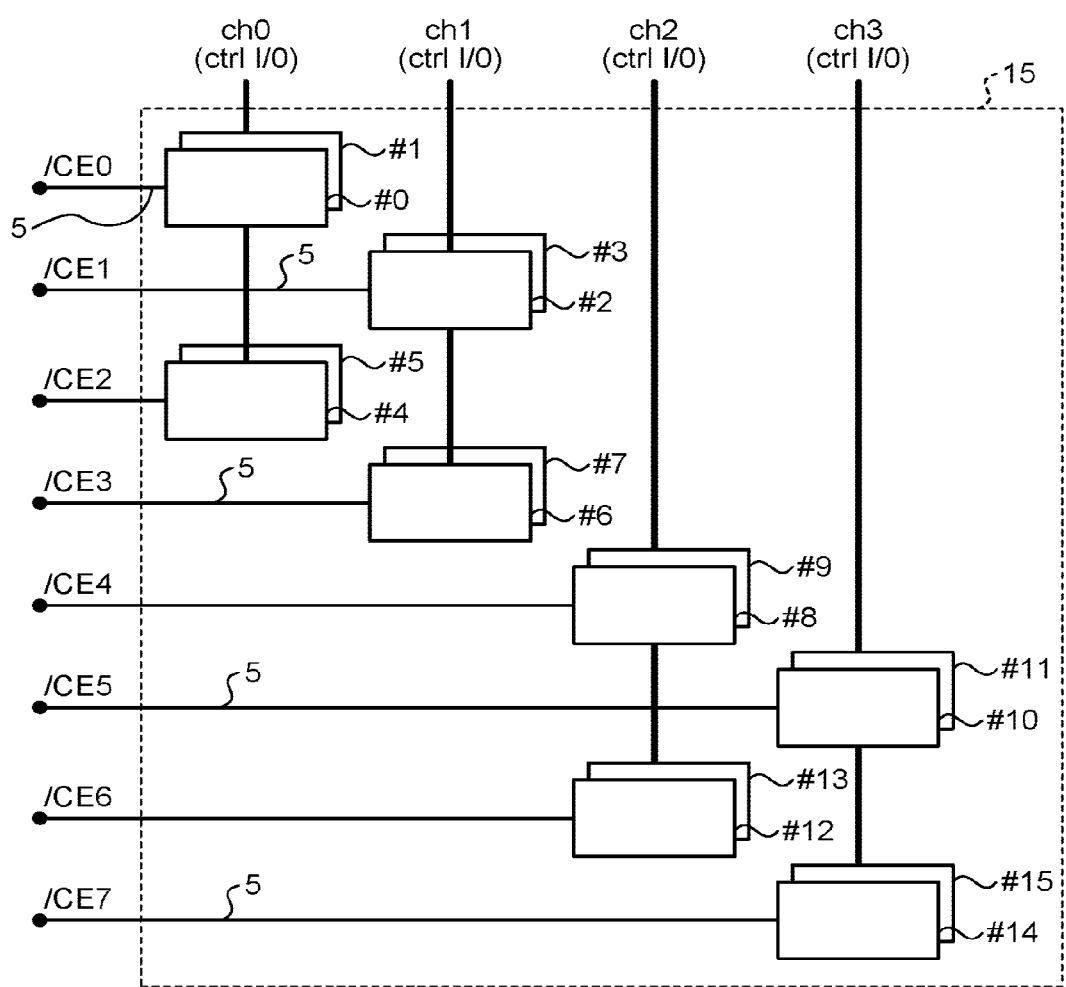
FIG. 2 is a block diagram of an internal configuration example of a memory package.

FIG. 2 is an example of a multi-chip package (a memory package) 15 that constitutes the NAND 10. According to the present embodiment, it is assumed that the NAND 10 of FIG. 1 is constituted by one memory package 15. The NAND 10 can be constituted by a plurality of the memory packages 15. The memory package 15 includes sixteen memory chips #0 to #15 and eight chip enable pins /CE0 to /CE7. "/" that denotes a negative logic is omitted below. That is, in this package 15, one chip enable pin of the memory package 15 is electrically connected to chip enable pins of two memory chips by an internal wire 5. In other words, a plurality of memory chips is selected by one chip enable pin (hereinafter, "CE pin") of the memory package 15.

The CE pin CE0 of the memory package 15 is electrically connected to CE pins of memory chips #0 and #1, the CE pin CE1 of the memory package 15 is electrically connected to CE pins of memory chips #2 and #3, the CE pin CE2 of the memory package 15 is electrically connected to CE pins of memory chips #4 and #5, the CE pin CE3 of the memory package 15 is electrically connected to CE pins of memory chips #6 and #7, the CE pin CE4 of the memory package 15 is electrically connected to CE pins of memory chips #8 and #9, the CE pin CE5 of the memory package 15 is electrically connected to CE pins of memory chips #10 and #11, the CE pin CE6 of the memory package 15 is electrically connected to CE pins of memory chips #12 and #13, and the CE pin CE7 of the memory package 15 is electrically connected to CE pins of memory chips #14 and #15. The memory chips #0, #1, #4, and #5 are connected to the channel 0 (ch0), the memory chips #2, #3, #6, and #7 are connected to the channel 1 (ch1), the memory chips #8, #9, #12, and #13 are connected to the channel 2 (ch2), and the memory chips #10, #11, #14, and #15 are connected to the channel 3 (ch3).

As shown in FIG. 2, when a plurality of the memory chips #0 to #15 is incorporated in one memory package 15, a chip enable signal CE and a chip address CADD are defined, and one memory chip can be selected among the memory chips #0 to #15 based on the chip enable signal CE and the chip address CADD. The chip address CADD is included in a part of an address signal input from the controller 20. The chip address CADD is input via the I/O signal lines IO0 to IO7 of the Ctrl I/O signals of the respective channels ch0 to ch3 to the respective memory chips.

Generally, by asserting a CE pin by the chip enable signal CE, one or a plurality of memory chips connected to the asserted CE pin can be selected among a plurality of memory chips in the memory package 15, and one memory chip can be selected among the selected one or plurality of memory chips by the chip address CADD. In a case of the memory package 15 shown in FIG. 2, eight CE pins CE0 to CE7 are respectively used to select two memory chips. By a 1-bit chip address CADD, one memory chip is selected among two memory chips selected by the CE pins CE0 to CE7. In a case where there are CE pins as many as the number of memory chips in the memory package 15, the chip address CADD is unnecessary.

Next, an example of an internal circuit of the memory chips #0 to #15 is explained. Because the respective memory chips #0 to #15 have an identical configuration, a configuration of the memory chip #0 is explained.

Figure 3:
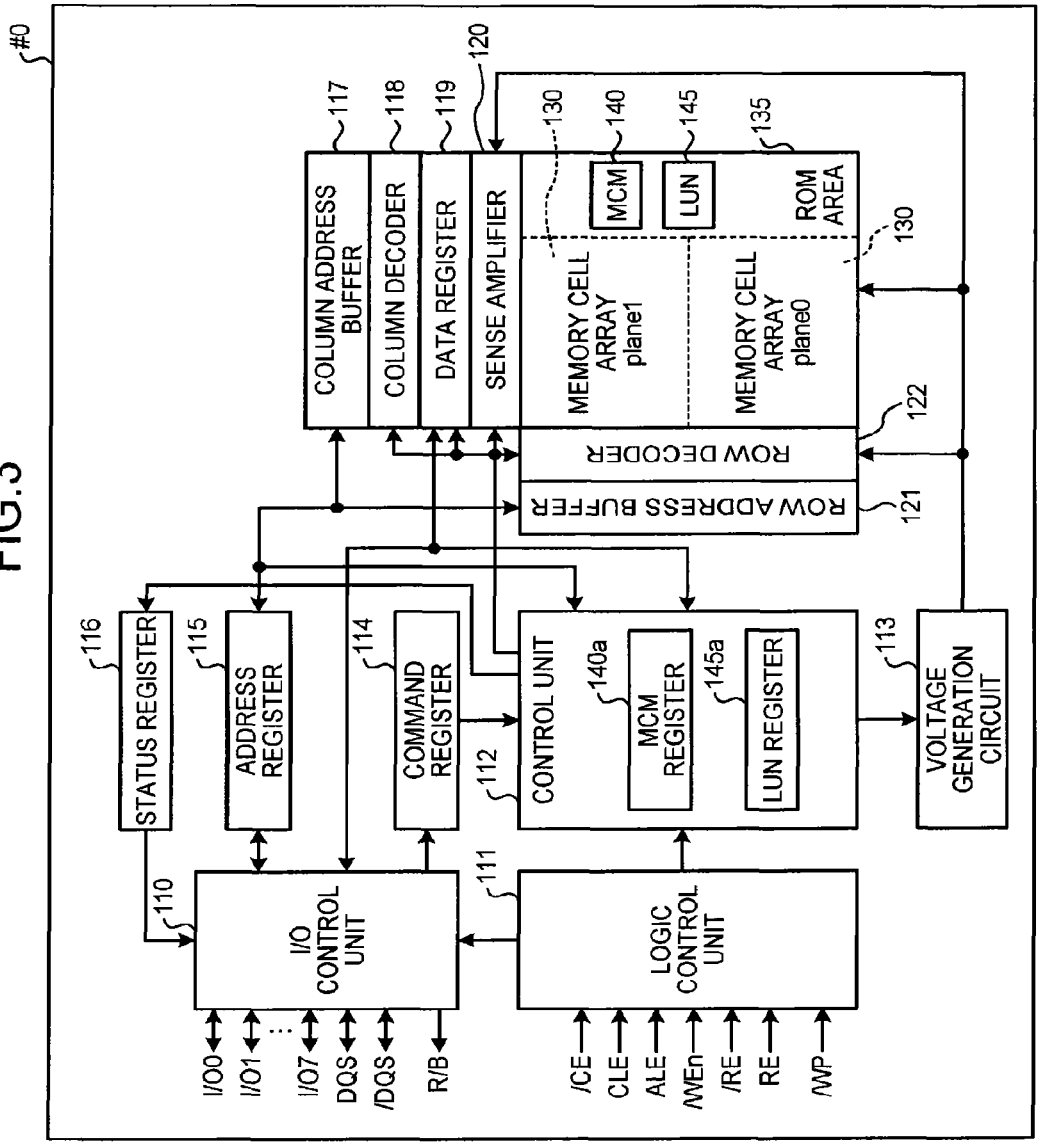
FIG. 3 is a block diagram of a circuit configuration example of a memory chip.

FIG. 3 is a block diagram of the configuration of the memory chip #0. The memory chip #0 includes an I/O control unit 110, a logic control unit 111, a control unit 112, a voltage generation circuit 113, a command register 114, an address register 115, a status register 116, a column address buffer 117, a column decoder 118, a data register 119, a sense amplifier 120, a row address buffer 121, a row decoder 122, a memory cell array 130, and a ROM area 135.

The logic control unit 111 receives inputs of various control signals via input pins of the various control signals (such as a CE and an ALE). The I/O control unit 110 distributes registers in which I/O signals are stored based on the control signals received by the logic control unit 111. The logic control unit 111 also transfers the received control signals to the control unit 112. CE shown as an input pin of the logic control unit 111 denotes a chip enable pin of the memory chip #0.

The control unit 112 includes a state transition circuit (a state machine) that transits a state based on various control signals received via the logic control unit 111, and controls the overall operation of the memory chip #0.

The I/O control unit 110 is a buffer circuit for transmitting and receiving I/O signals via I/O signal pins I/O0 to I/O7 to and from the controller 20. A command, an address, and data (write data) fetched as I/O signals by the I/O control unit 110 via the I/O signal pins I/O0 to I/O7 are distributed to the address register 115, the command register 114, and the data register 119, respectively and stored therein.

Because an I/O signal pin is 8 bits, an 8-bit address can be transferred at the same time via the I/O signal pin. However, in most cases, the bit number of an address transmitted from the controller 20 is larger than 8 bits. Therefore, an address is transmitted in plural times via an 8-bit I/O signal pin to the I/O control unit 110. The address register 115 accumulates addresses transmitted thereto in plural times and combines these addresses into one.

As explained later, several high-order bits (3 bits in the first embodiment) of a combined address are used as the chip address CADD serving as a chip identification bit that identifies a memory chip. That is, the combined address includes, from a high-order bit side, the chip address CADD, a row address, and a column address. The chip address CADD is input from the address register 115 to the control unit 112. The row address is input from the address register 115 to the row address buffer 121. The column address is input from the address register 115 to the column address buffer 117.

The control unit 112 instructs the voltage generation circuit 113 about a voltage value to be generated and a power supply timing. The voltage generation circuit 113 supplies power to the memory cell array 130 and peripheral circuits thereof according to control of the control unit 112. Status information that indicates whether writing to a memory cell array is successful, status information that indicates whether erasure of a memory cell array is successful, and the like are stored in the status register 116. Such status information is transmitted to the controller 20 as a response signal by the I/O control unit 110.

The memory cell array 130 is constituted by arranging NAND memory cells, and write data from the host 1 is stored in the memory cell array 130. The memory cell array 130 is divided into two areas (Districts), that is, a plane 0 and a plane 1, each of which includes a plurality of physical blocks. The planes 0 and 1 respectively include independent peripheral circuits (such as a row decoder, a column decoder, a page buffer, and a data register) and can perform erasing/writing/reading at the same time. The memory cell array 130 does not need to be divided into plural planes.

The memory cell array 130 includes the ROM area 135 in which management information of the memory system 100 is stored. The ROM area 135 is a part of the memory cell array 130 and is an area constituted by NAND memory cells, similarly to the memory cell array 130. For example, a manufacturer of the memory chip #0 or a manufacturer of the memory system 100 can rewrite the ROM area 135, but a user of the memory system 100 cannot access (read, write, and erase) the ROM area 135. Management information of various types is stored in the ROM area 135. The management information includes an MCM (multichip module) 140 and a LUN (Logical Unit Number) 145. These MCM 140 and LUN 145 are explained later.

The row decoder 122, the column decoder 118, and the sense amplifier 120 access the memory cell array 130 based on control by the control unit 112. The row decoder 122 selects a word line corresponding to a row address and activates the selected word line. The column decoder 118 selects a bit line corresponding to a column address and activates the selected bit line. The sense amplifier 120 applies a voltage to the bit line selected by the column decoder 118 to write data stored in the data register 119 in a memory cell transistor at an intersection of the word line selected by the row decoder 122 and the bit line selected by the column decoder 118. Furthermore, the sense amplifier 120 reads data stored in the memory cell transistor at the intersection of the word line selected by the row decoder 122 and the bit line selected by the column decoder 118 via the bit line and stores the read data in the data register 119. The data stored in the data register 119 is transmitted via a data line to the I/O control unit 110 and then transferred from the I/O control unit 110 to the controller 20.

The control unit 112 includes an MCM register 140a and a LUN register 145a. When a power supply of each memory chip is turned on, the MCM 140 and the LUN 145 stored in the ROM area 135 are read and stored in the MCM register 140a and the LUN register 145a, respectively.

A LUN is n-bit information (n is an integer of 2 or more) for identifying each memory chip. The respective memory chips are numbered by the LUN. The LUN is a comparison target of the chip address CADD when one memory chip is selected by the chip address CADD among a plurality of memory chips selected by asserting the chip enable signal CE of the controller 20. As a result of comparison, a memory chip having a LUN that matches the chip address CADD set therein is selected.

As shown in FIG. 1, the memory package 15 is connected to the controller 20. A chip enable pin of the memory package 15 is electrically connected to a chip enable pin of the controller 20. When the number of CE pins of memory chips connected to one CE pin of the controller 20 is determined in advance (for example, two), it suffices that a 1-bit LUN for identifying two memory chips is stored in the memory chips in advance. Similarly, when the number of CE pins of memory chips connected to one CE pin of the controller 20 is determined to be four in advance, it suffices that a 2-bit LUN for identifying four memory chips is stored in the memory chips in advance. Furthermore, when the number of CE pins of memory chips connected to one CE pin of the controller 20 is determined to be eight in advance, it suffices that a 3-bit LUN for identifying eight memory chips is stored in the memory chips in advance.

According to the first embodiment, it is assumed that the number of CE pins of memory chips connected to a CE pin of a controller is variable. That is, it is assumed that when the controller 20 is connected to the memory package 15, connection relationships between a plurality of CE pins of the controller 20 and a plurality of CE pins of the memory package 15 are variable (selectable). It is assumed that, for example, at the time of connecting the controller 20 to the memory package 15 on a PCB by wires to be assembled, the number of chip enable pins of memory chips connected to one CE pin of a controller is selectable such as 2, 4, 8, ..., $2^n$. As explained later in detail, according to the first embodiment, to cause the number of chip enable pins of memory chips connected to one CE pin of a controller to be extendable to 2 to the n-th power, a LUN stored in each memory chip is set to be bit information of n-bits. For example, to cause the number of memory chips connected to one CE pin of the controller 20 to be extendable to 16 (=2 to the fourth power), a 4-bit LUN is stored in each memory chip.

Figure 4:
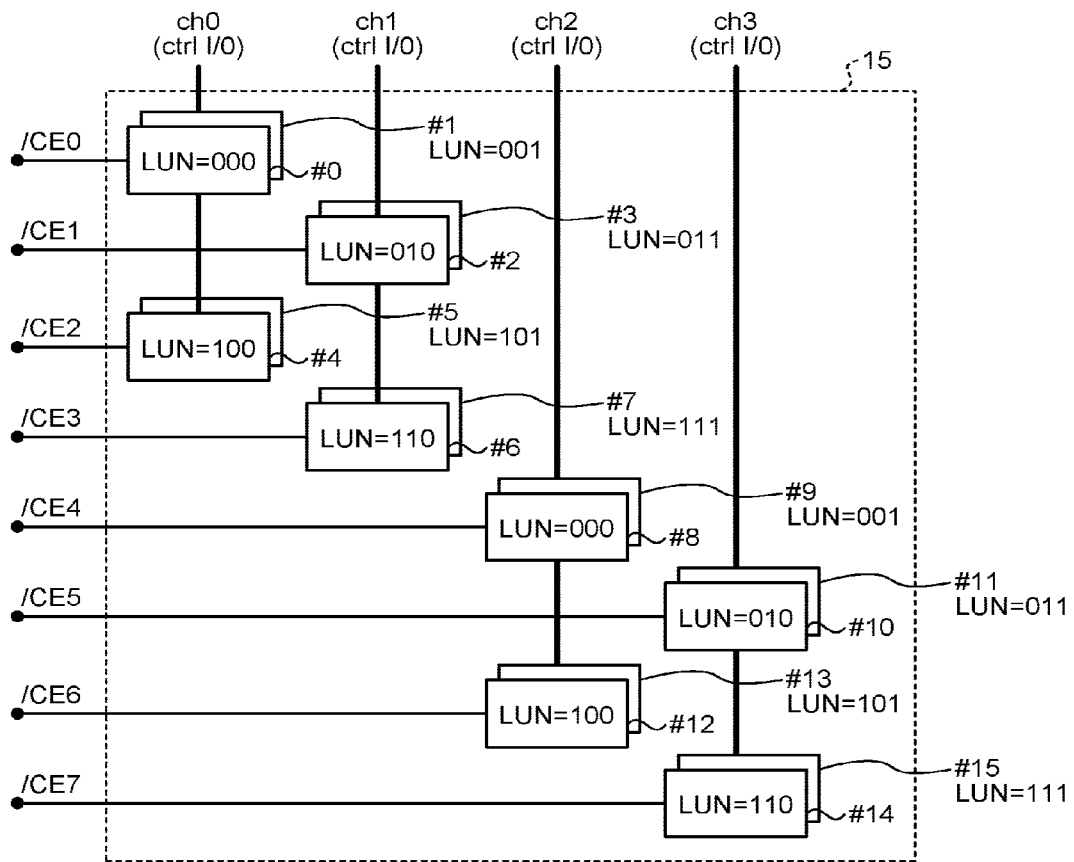
FIG. 4 illustrates an example of LUN setting according to a first embodiment.

According to the first embodiment, as shown in FIG. 4, a 3-bit LUN is stored in the respective memory chips #0 to #15 so that the number of memory chips connected to one CE pin of the controller 20 is extendable to 8 (=2 to the third power). A LUN value written in the respective memory chips #0 to #15 shown in FIG. 4 indicates the LUN 145 stored in the ROM area 135 of the memory cell array 130. As explained above, the LUN can be rewritten by a manufacturer of a memory chip or a manufacturer of the memory system 100. FIG. 4 is an example of LUN setting when the NAND 10 is constituted by sixteen memory chips as shown in FIG. 2. In FIG. 4, the memory chips #0 to #7 connected to the CE pins CE0 to CE3 are set to have LUN=000 to LUN=111. Similarly, the memory chips #8 to #15 connected to the CE pins CE4 to CE7 are set to have LUN=000 to LUN=111.

Figure 5:
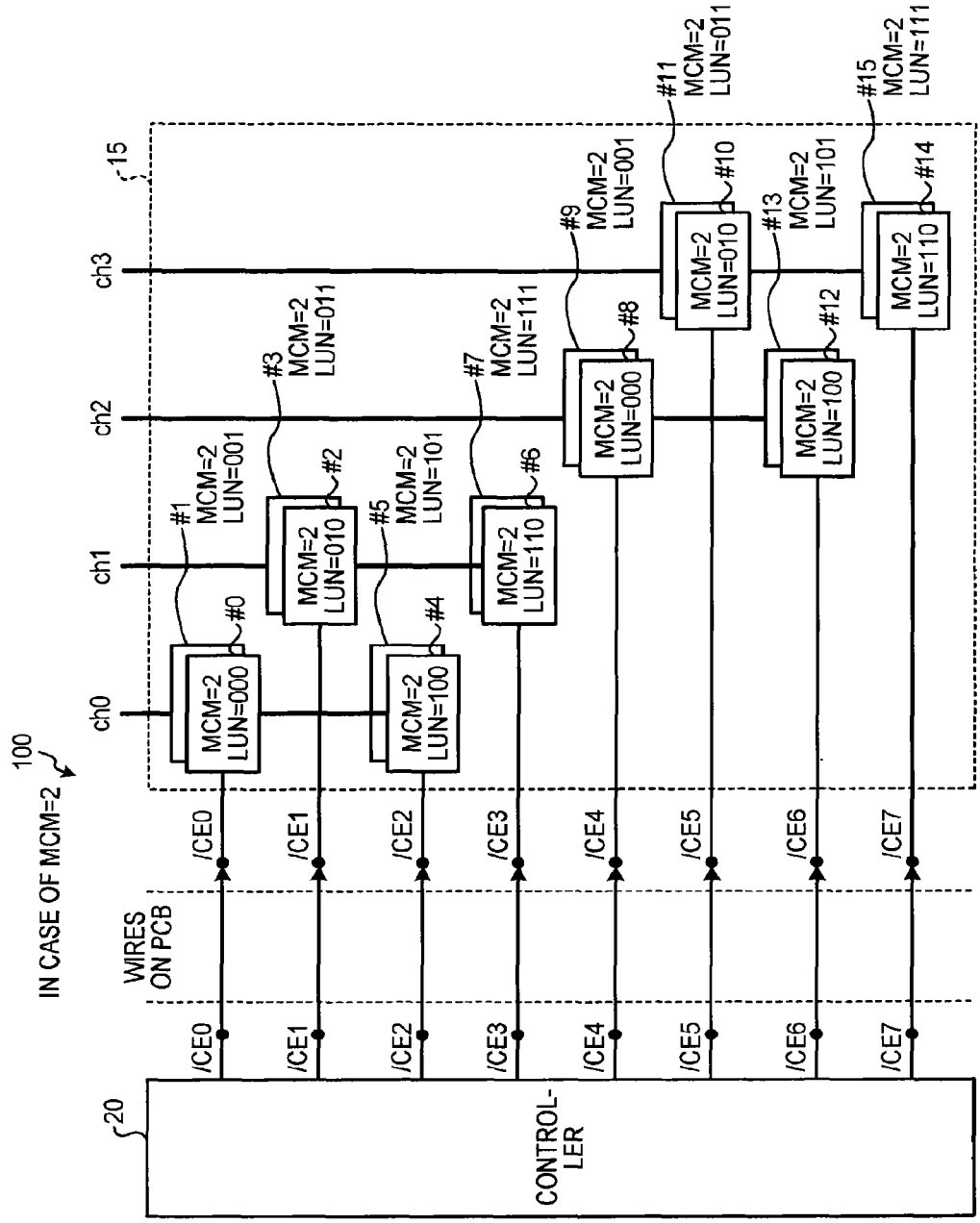
FIG. 5 illustrates chip enable wiring and LUN setting in a case of MCM=2.
Figure 11:
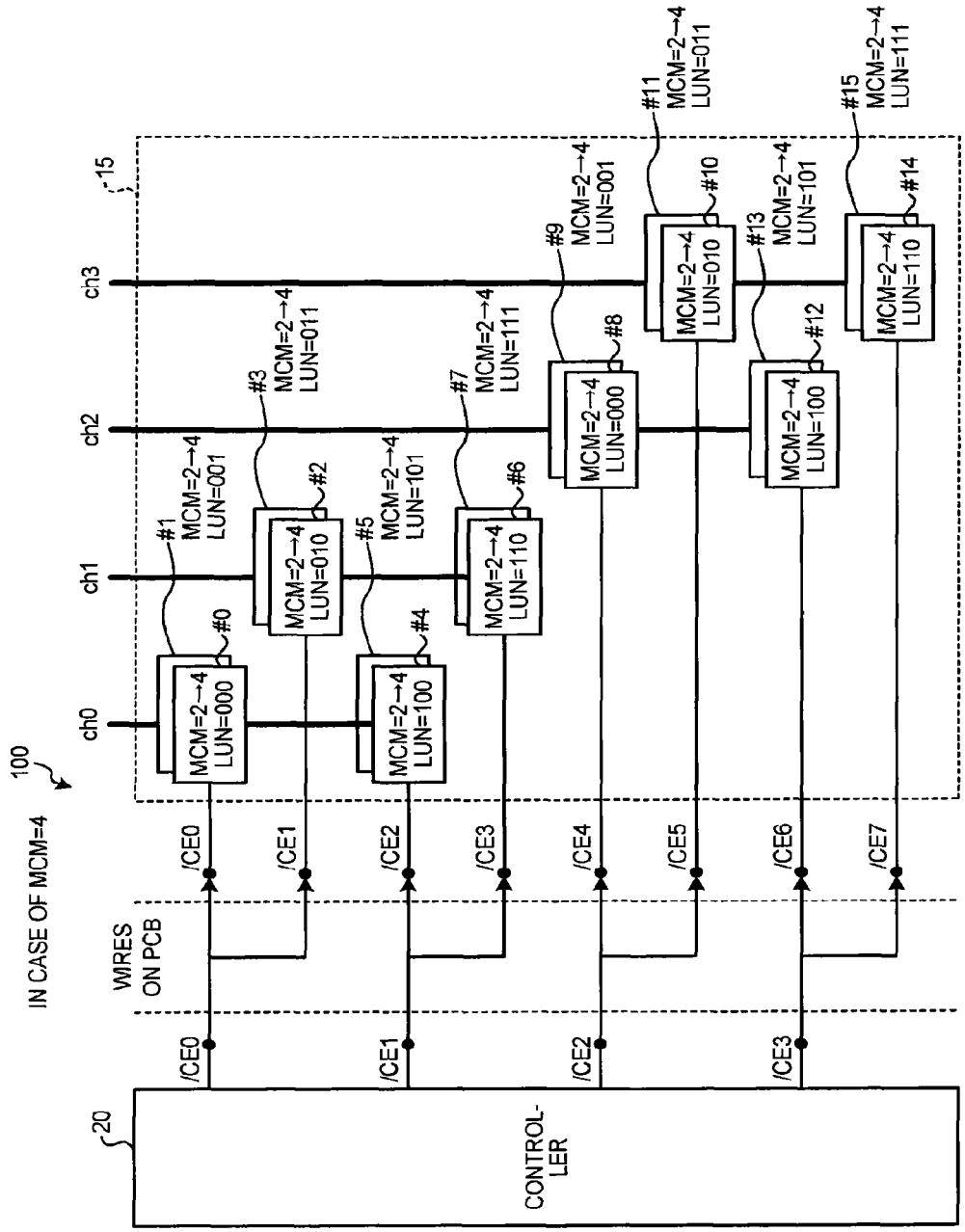
FIG. 11 illustrates chip enable wiring and LUN setting in a case where MCM=2 is changed to MCM=4.
Figure 13:
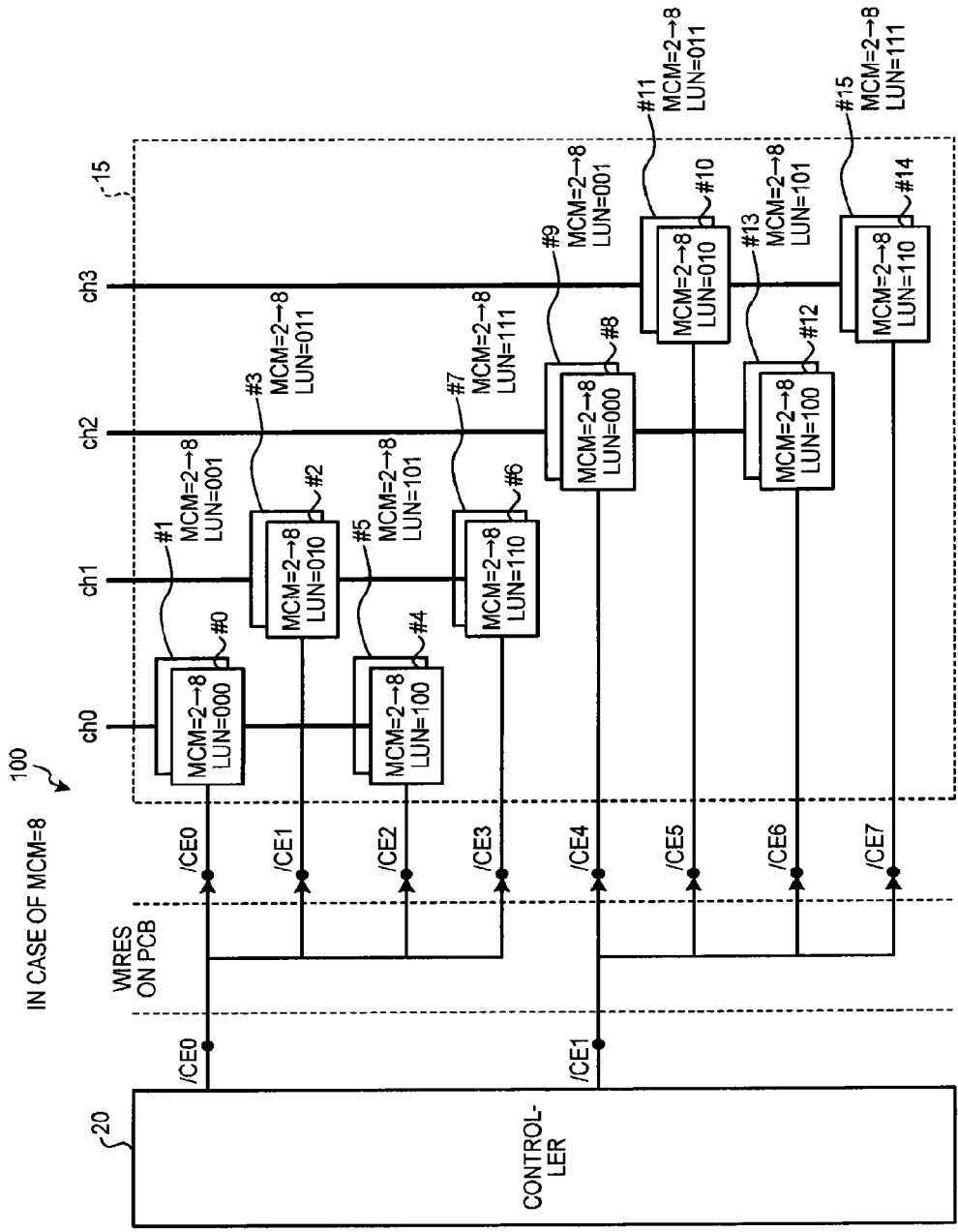
FIG. 13 illustrates chip enable wiring and LUN setting in a case where MCM=2 is changed to MCM=8.

By setting the LUN to 3 bits, the memory package 15 shown in FIG. 4 can be connected to the controller 20 as shown in FIGS. 5, 11, and 13.

As explained above, when the number of memory chips connected to one CE pin of the controller 20 is extendable to 2 to the n-th power, the number of CE pins of memory chips connected to a CE pin of the controller 20 varies depending on changes in the connection relationships between plural CE pins of the controller 20 and plural CE pins of the memory package 15. When the number of CE pins of memory chips connected to a CE pin of the controller 20 varies, it means that the bit number of a LUN required for identifying a memory chip varies. Therefore, which bit in a bit column of an n-bit LUN becomes effective is determined by an MCM.

The MCM 140 stored in the ROM area 135 of the memory cell array 130 is information for determining which bit in a bit column of a LUN becomes effective. The MCM 140 is determined by the number of CE pins of memory chips electrically connected to one CE pin of the controller 20. In other words, the MCM is determined by the number of memory chips electrically connected to one CE pin of the controller 20. When the number of CE pins of the controller 20 is denoted as L and the number of memory chips incorporated in a memory package is denoted as M, MCM=M/L. For example, when the number of CE pins of the controller 20 is four and a memory package having sixteen memory chips incorporated therein is connected to the controller 20, MCM=16/4=4 regardless of the number of CE pins of the memory package. Therefore, the MCM is determined by a manufacturer of the memory system 100 who assembles the NAND 10 and the controller 20.

As shown in FIG. 4, it is assumed that a LUN is 3 bits. In a case of MCM=1, one memory chip is connected to one CE pin of the controller 20, and thus it is unnecessary to compare the LUN to the chip address CADD. For this reason, in the case of MCM=1, all bits in a bit column of the LUN are not recognized as effective bits. An effective bit is a bit that is a comparison target of the chip address CADD.

In a case of MCM=2, two memory chips are connected to one CE pin of the controller 20, and thus it suffices that the LUN is compared to the chip address CADD to identify two memory chips. For this reason, in the case of MCM=2, a low-order 1 bit in a bit column of the LUN is recognized as an effective bit and high-order 2 bits are ignored.

In a case of MCM=4, four memory chips are connected to one CE pin of the controller 20, and thus it suffices that the LUN is compared to the chip address CADD to identify four memory chips. For this reason, in the case of MCM=4, low-order 2 bits in a bit column of the LUN are recognized as effective bits and a high-order 1 bit is ignored.

In a case of MCM=8, eight memory chips are connected to one CE pin of the controller 20, and thus it suffices that the LUN is compared to the chip address CADD to identify eight memory chips. For this reason, in the case of MCM=8, all 3 bits in a bit column of the LUN are recognized as effective bits.

FIG. 5 illustrates a configuration example of the memory system 100 in the case of MCM=2. At the time of manufacturing the memory package 15, it is assumed that CE pins of the controller 20 are connected to eight CE pins CE0 to CE7 of the memory package 15 on a one-to-one basis. The memory package 15 that constitutes the NAND 10 has eight CE pins CE0 to CE7 and includes sixteen memory chips #0 to #15 therein. Accordingly, at the time of manufacturing the memory package 15, MCM=2 is set. In a case of FIG. 5, because CE pins of the controller 20 are connected to CE pins of the memory package 15 on a one-to-one basis, even after wiring of the CE pins of the controller 20 and the memory package 15 is performed to assemble the memory system 100, the number of chip enable signals on a side of the memory package 15 does not change. Therefore, even after the memory system 100 is assembled, MCM=2 can be kept. MCM=2 and LUN=000 to 111 in the respective memory chips #0 to #15 of FIG. 5 indicate the MCM 140 and the LUN 145 set in the ROM area 135 of each of the memory chips #0 to #15. An MCM (MCM=2) does not need to be changed before and after assembling.

Figure 6:
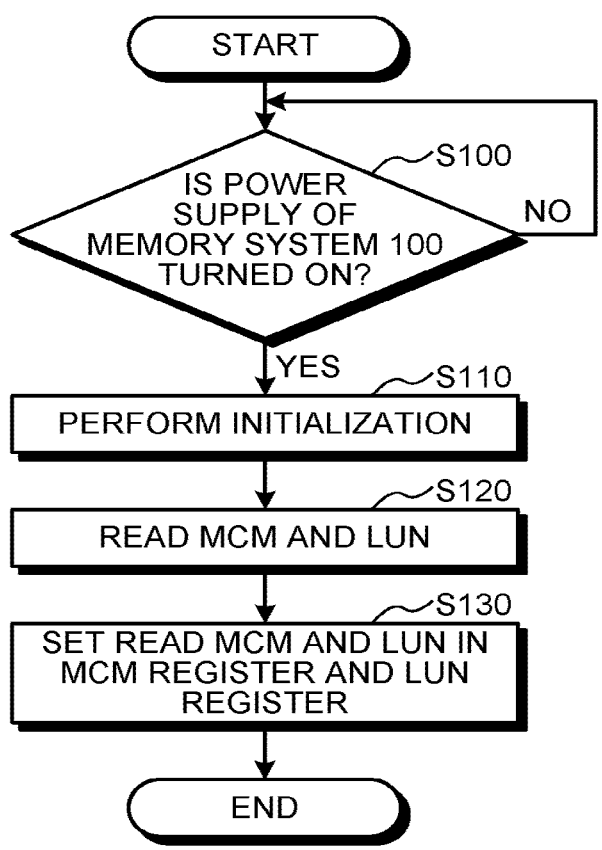

FIG. 6 is a flowchart of an operation of the respective memory chips #0 to #15 when a power supply of the memory system 100 is turned on. When the control unit 112 of each of the memory chips #0 to #15 detects that the power supply of the memory system 100 is turned on (Step S100), the control unit 112 performs an initialization process including voltage setting, operation timing setting, and setting of various parameters (Step S110). The control unit 112 of each of the memory chips #0 to #15 reads the MCM 140 and the LUN 145 stored in the ROM area 135 (Step S120) and stores the read MCM 140 and LUN 145 in the MCM register 140a and the LUN register 145a within the control unit 112 (Step S130). As a result, in the respective memory chips #0 to #15, MCM=2 is set in the MCM register 140a and the LUN 145 stored in the ROM area 135 is set in the LUN register 145a. In FIG. 6, while Steps S120 and S130 are separated from the initialization at Step S110 in order to clearly describe reading of an MCM and a LUN and setting of these MCM and LUN in registers, Steps S120 and S130 can be a part of the initialization at Step S110.

Figure 7:
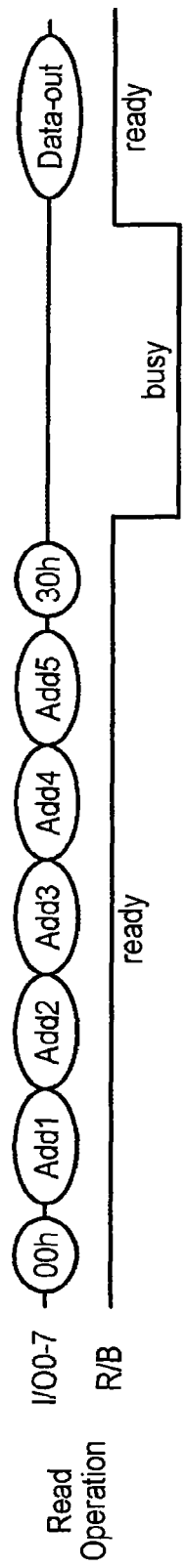
FIG. 7 is a time chart of an example of a reading operation.

FIG. 7 illustrates an example of a time chart at the time of reading. A first read command (00h) is input to an I/O signal line first, address signals Add1 to Add5 are then input thereto in five times, and a second read command (30h) is input thereto. After the second read command (30h) is input, the control unit 112 switches a ready/busy signal R/B to a busy state and performs a process of reading data from a specified address. When data is read from the specified address of the memory cell array 130 and set in the data register 119, the control unit 112 switches the ready/busy signal R/B to a ready state. The data set in the data register 119 is then output to the I/O signal line by the I/O control unit 110.

FIG. 8 illustrates an example of an address signal input in five cycles. The address signal Add1 input in a first cycle and the address signal Add2 input in a second cycle include a column address. The address signal Add3 input in a third cycle includes a page address. The address signal Add4 input in a fourth cycle includes a plane address and a part of a block address. The address signal Add5 input in a fifth cycle includes the remaining block address and the chip address CADD. The chip address CADD is constituted by 3 bits, that is, A36 to A38 so as to correspond to a 3-bit LUN.

Figure 9:
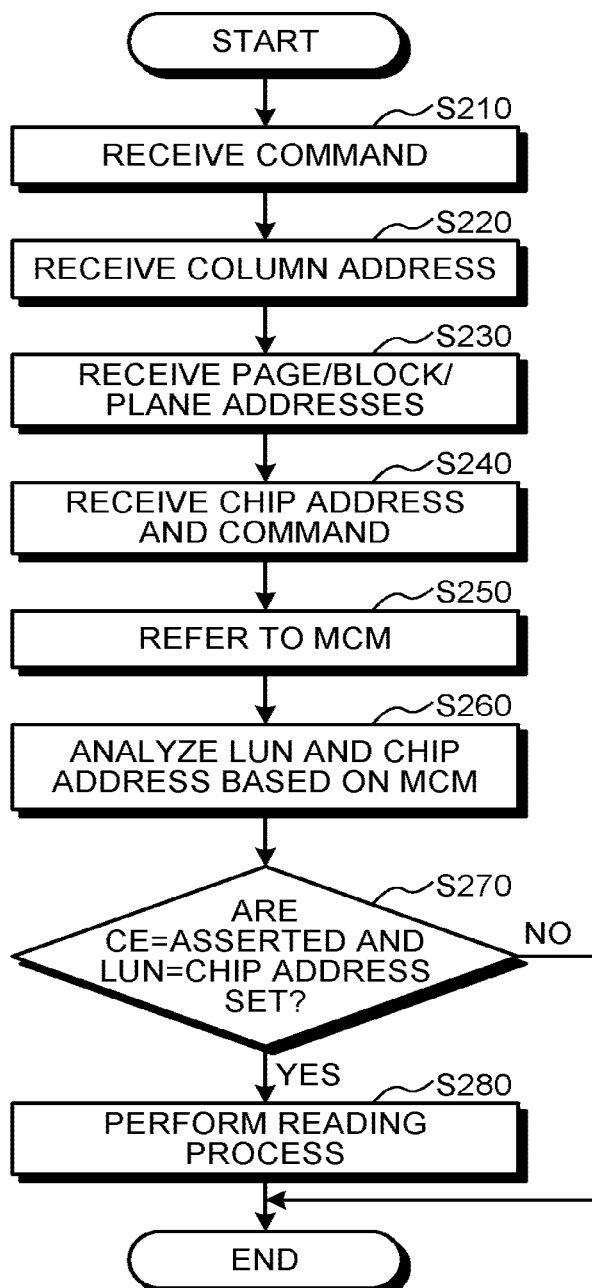
FIG. 9 is a flowchart of an operation procedure of the memory chip at the time of reading.

FIG. 9 is a flowchart of an operation of the respective memory chips #0 to #15 at the time of reading. The I/O control unit 110 of each of the memory chips #0 to #15 receives the first read command (00h) and sets this command in the command register 114 (Step S210). The first read command (00h) set in the command register 114 is input to the control unit 112. The I/O control unit 110 of each of the memory chips #0 to #15 receives a column address and set this column address in the address register 115. The column address set in the address register 115 is buffered in the column address buffer 117 (Step S220). The I/O control unit 110 of each of the memory chips #0 to #15 receives a row address constituted by a page address, a plane address, and a block address to set this row address in the address register 115. The row address set in the address register 115 is buffered in the row address buffer 121 (Step S230).

The I/O control unit 110 of each of the memory chips #0 to #15 receives the chip address CADD and sets this chip address in the address register 115. The chip address CADD set in the address register 115 is input to the control unit 112. The I/O control unit 110 receives the second read command (30h) and sets this command in the command register 114. The second read command (30h) set in the command register 114 is input to the control unit 112 (Step S240).

The control unit 112 of each of the memory chips #0 to #15 refers to an MCM stored in the MCM register 140a (Step S250). As explained above, every time a power supply of each of the memory chips #0 to #15 is turned on, the MCM 140 and the LUN 145 stored in the ROM area 135 are read and stored in the MCM register 140a and the LUN register 145a. In this case, as shown in FIG. 5, MCM=2 is set. The control unit 112 of each of the memory chips #0 to #15 determines effective bits of a 3-bit LUN set in the LUN register 145a and of a 3-bit chip address CADD based on an MCM value (Step S260). Because MCM=2 is set in this case, as explained above, the control unit 112 recognizes only a low-order 1 bit of the 3-bit LUN set in the LUN register 145a as an effective bit and only a low-order 1 bit A36 of the 3-bit chip address CADD as an effective bit. The control unit 112 ignores high-order 2 bits of the 3-bit LUN and high-order 2 bits A37 and A38 of the chip address CADD.

When the chip enable signal CE input to a CE pin of its own memory chip is asserted ("low" in this case) and the effective bit of the LUN matches the effective bit of the chip address CADD as a result of comparison (Yes at step 270), the control unit 112 of each of the memory chips #0 to #15 determines that this read is directed to its own memory chip. The control unit 112 then reads data from the memory cell array 130 by using the column address and the row address buffered in the column address buffer 117 and the row address buffer 121 and outputs the read data via the data register 119 and the I/O control unit 110 to an I/O signal line (Step S280). On the other hand, when the chip enable signal CE is negated ("high" in this case) or the effective bit of the LUN does not match the effective bit of the chip address CADD as a result of comparison (No at Step S270), the control unit 112 determines that this reading is not directed to its own memory chip and does not perform a reading process.

Figure 10:
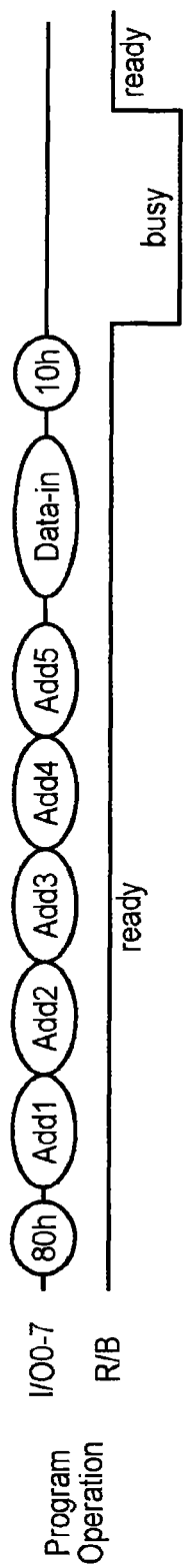
FIG. 10 is a time chart of an example of a writing operation.

FIG. 10 illustrates an example of a time chart at the time of writing. A first write command (80h) is input to an I/O signal line first, address signals Add1 to Add5 are then input thereto in five times, and write data Data-in and a second write command (10h) are input thereto. After the second write command (10h) is input, the control unit 112 switches the ready/busy signal R/B to a busy state and performs a writing process on a specified address. When data is written in the specified address of the memory cell array 130, the control unit 112 switches the ready/busy signal R/B to a ready state.

Also in this writing process, as explained at Steps S250 to 280 of FIG. 9, effective bits of a LUN and the chip address CADD are selected based on an MCM value stored in the MCM register 140a. When the chip enable signal CE is asserted and the effective bit of the LUN matches the effective bit of CADD as a result of comparison, the writing process is performed.

Next, a case where a manufacturer of the memory system 100 connects a controller with a reduced number of chip enable pins to a memory package to configure the memory system 100 is explained. It is assumed that the manufacturer of the memory system 100 uses the memory package 15 that constitutes the NAND 10 and is shown in FIG. 4 and the controller 20 shown in FIG. 11 to assemble the memory system 100 shown in FIG. 11. The memory package 15 shown in FIG. 4 includes eight CE pins CE0 to CE7 and sixteen memory chips #0 to #15, and thus MCM=2 is set by a manufacturer of the memory package 15 before assembling. As shown in FIG. 11, a LUN set in the ROM area 135 of each of the memory chips #0 to #15 is set to LUN=000 to 111 by a manufacturer of the NAND 10 before assembling.

The controller 20 shown in FIG. 11 includes four CE pins CE0 to CE3. Because the controller 20 includes four CE pins CE0 to CE3 and the memory package 15 includes sixteen memory chips #0 to #15 and eight chip enable pins CE0 to CE7, when the controller 20 is connected to the memory package 15, four memory chips are connected to one CE pin of the controller 20 and MCM=4 is obtained.

The manufacturer of the memory system 100
(a) changes setting of the MCM 140 of the ROM area 135 of each of all memory chips #0 to 190 15 included in the memory package 15 to MCM=4, and
(b) connects the CE pins CE0 to CE3 of the controller 20 to the CE pins CE0 to CE7 of the memory package 15 on a PCB by wires so that MCM=4 is obtained, thereby assembling the memory system 100.
However, the manufacturer of the memory system 100 does not need to change setting of the LUN 145.

Figure 12:
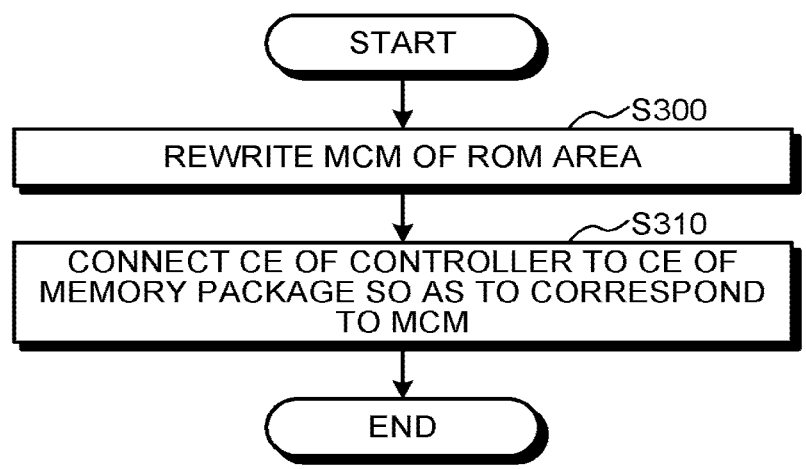
FIG. 12 is a flowchart of an assembling procedure of the memory system.

According to a first method, the procedure (a) is performed first and the procedure (b) is then performed. FIG. 12 illustrates an operation procedure of the first method. A manufacturer of the memory system 100 uses a test device that is accessible to memory cell areas to change setting of the MCM 140 of the ROM area 135 of each of the memory chips #0 to #15 of the memory package 15 from MCM=2 to MCM=4 (Step S300). As shown in FIG. 6, because the MCM 140 of the ROM area 135 is set in the MCM register 140a every time the memory package 15 starts up, setting of an MCM value of the MCM register 140a of each of the memory chips #0 to #15 can be changed to MCM=4. The manufacturer of the memory system 100 then connects four CE pins CE0 to CE3 of the controller 20 to eight CE pins CE0 to CE7 of the memory package 15 by wires so as to obtain a ratio of 1:2 on a PCB as shown in FIG. 11 (Step S310). That is, the CE0 of the controller 20 is connected commonly to the CE0 and CE1 of the memory package 15, the CE1 of the controller 20 is connected commonly to the CE2 and CE3 of the memory package 15, the CE2 of the controller 20 is connected commonly to the CE4 and CE5 of the memory package 15, and the CE3 of the controller 20 is connected commonly to the CE6 and CE7 of the memory package 15.

According to a second method, the procedure (b) is performed first and the procedure (a) is then performed. That is, the manufacturer of the memory system 100 changes an assembly so that four CE pins CE0 to CE3 of the controller 20 are connected to eight CE pins CE0 to CE7 of the memory package 15 by wires so as to obtain a ratio of 1:2 on a PCB as shown in FIG. 11. The manufacturer of the memory system 100 transmits predetermined commands, addresses, and data from the controller 20 to the memory package 15, thereby changing setting of the MCM 140 of the ROM area 135 of each of the memory chips #0 to #15 from MCM=2 to MCM=4. As shown in FIG. 6, because the MCM 140 of the ROM area 135 is set in the MCM register 140a every time the memory package 15 starts up, setting of an MCM value of the MCM register 140a of each of the memory chips #0 to #15 can be changed to MCM=4.

At the time of reading and writing of the memory system 100 shown in FIG. 11, the control unit 112 of each of the memory chips #0 to #15 refers to an MCM value stored in the MCM register 140a (Step S250 of FIG. 9). In this case, because MCM=4 is set, as explained above, the control unit 112 determines low-order 2 bits of a 3-bit LUN set in the LUN register 145a as effective bits and low-order 2 bits A36 and A37 of 3-bit chip address CADD as effective bits, and ignores a high-order 1 bit of the 3-bit LUN and a high-order 1 bit A38 of the chip address CADD (Step S260).

When the chip enable signal CE input to its own memory chip is asserted ("low" in this case) and the effective bit of the LUN matches the effective bit of the chip address CADD as a result of comparison (Yes at Step S270), the control unit 112 of each of the memory chips #0 to #15 performs the reading process and the writing process (Step S280). On the other hand, when the chip enable signal CE is negated ("high" in this case) or the effective bit of the LUN does not match the effective bit of the chip address CADD as a result of comparison (No at Step S270), the control unit 112 does not perform the reading process and the writing process.

Next, another example of assembling by a manufacturer of the memory system 100 is explained with reference to FIG. 13. It is assumed that the manufacturer of the memory system 100 uses the memory package 15 that constitutes the NAND 10 and is shown in FIG. 4 and the controller 20 shown in FIG. 13 to assemble the memory system 100 shown in FIG. 13. In the memory package 15 shown in FIG. 4, as explained above, MCM=2 is set before assembling. As shown in FIG. 13, a LUN set in the ROM area 135 of each of the memory chips #0 to #15 is set to LUN=000 to 111 before assembling.

The controller 20 shown in FIG. 13 includes two CE pins CE0 and CE1. Because the controller 20 includes two CE pins CE0 and CE1 and the memory package 15 includes sixteen memory chips #0 to #15 and eight chip enable pins CE0 to CE7, when the controller 20 is connected to the memory package 15, eight memory chips are connected to one chip enable pin of the controller 20 and MCM=8 is obtained.

As explained above, the manufacturer of the memory system 100

(a) changes setting of the MCM 140 of the ROM area 135 of each of all memory chips #0 to #15 included in the memory package 15 to MCM=8, and (b) connects the CE pins CE0 and CE1 of the controller 20 to the CE pins CE0 to CE7 of the memory package 15 on a PCB by wires so that MCM=8 is obtained, thereby assembling the memory system 100.

However, the manufacturer of the memory system 100 does not need to change setting of the LUN 145. As explained above, it is possible to perform whichever of the procedures (a) and (b) first.

Also in the memory system 100 of FIG. 13, as shown in FIG. 6, when the power supply of the memory system 100 is turned on, the control unit 112 of each of the memory chips #0 to #15 reads the MCM 140 and the LUN 145 stored in the ROM area 135 of the memory cell array 130, and stores the read MCM 140 and LUN 145 in the MCM register 140a and the LUN register 145a within the control unit 112 and sets them therein. Therefore, in the respective memory chips #0 to #15, MCM=8 is set in the MCM register 140a and the LUN 145 stored in the ROM area 135 is set in the LUN register 145a.

At the time of reading and writing of the memory system 100 shown in FIG. 13, the control unit 112 of each of the memory chips #0 to #15 refers to an MCM value stored in the MCM register 140a (Step S250 of FIG. 9). In this case, because MCM=8 is set, as explained above, the control unit 112 determines all 3 bits of a 3-bit LUN set in the LUN register 145a as effective bits and 3 bits A36, A37, and A38 of a 3-bit chip address CADD as effective bits (Step S260).

When the chip enable signal CE input to its own memory chip is asserted ("low" in this case) and the effective bit of the LUN matches the effective bit of the chip address CADD as a result of comparison (Yes at Step S270), the control unit 112 of each of the memory chips #0 to #15 performs the reading process and the writing process (Step S280). On the other hand, when the chip enable signal CE is negated ("high" in this case) or the effective bit of the LUN does not match the effective bit of the chip address CADD as a result of comparison (No at Step S270), the control unit 112 does not perform the reading process and the writing process.

Figure 14:
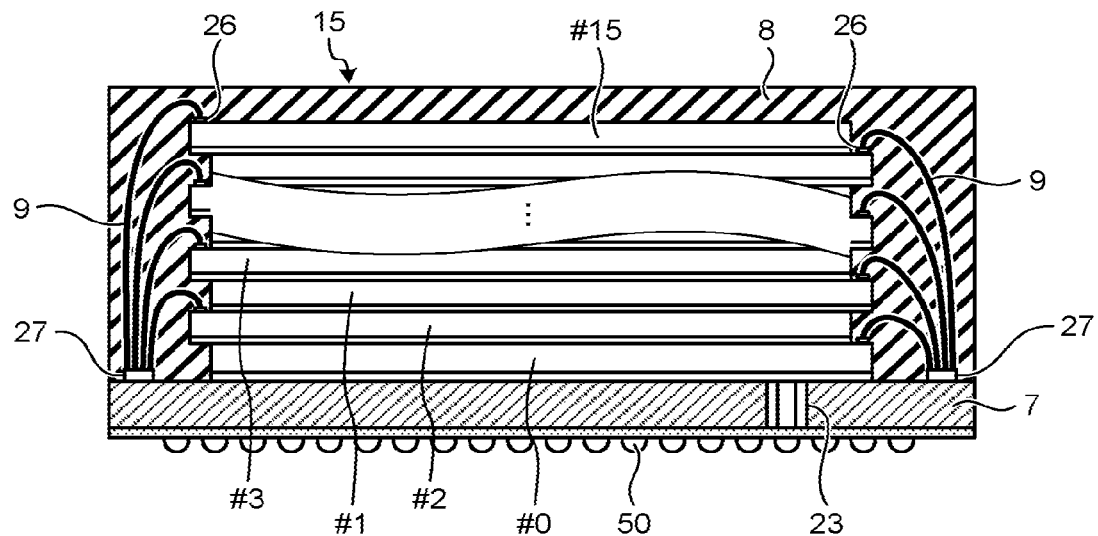
FIG. 14 is a cross-sectional view of a mounting structure of the memory package.
Figure 15:
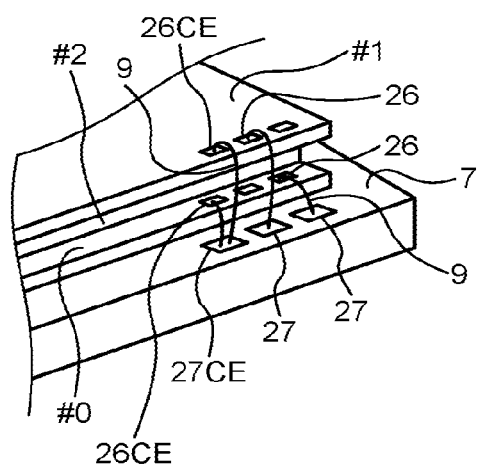
FIG. 15 is a perspective view of the mounting structure of the memory package.
Figure 16:
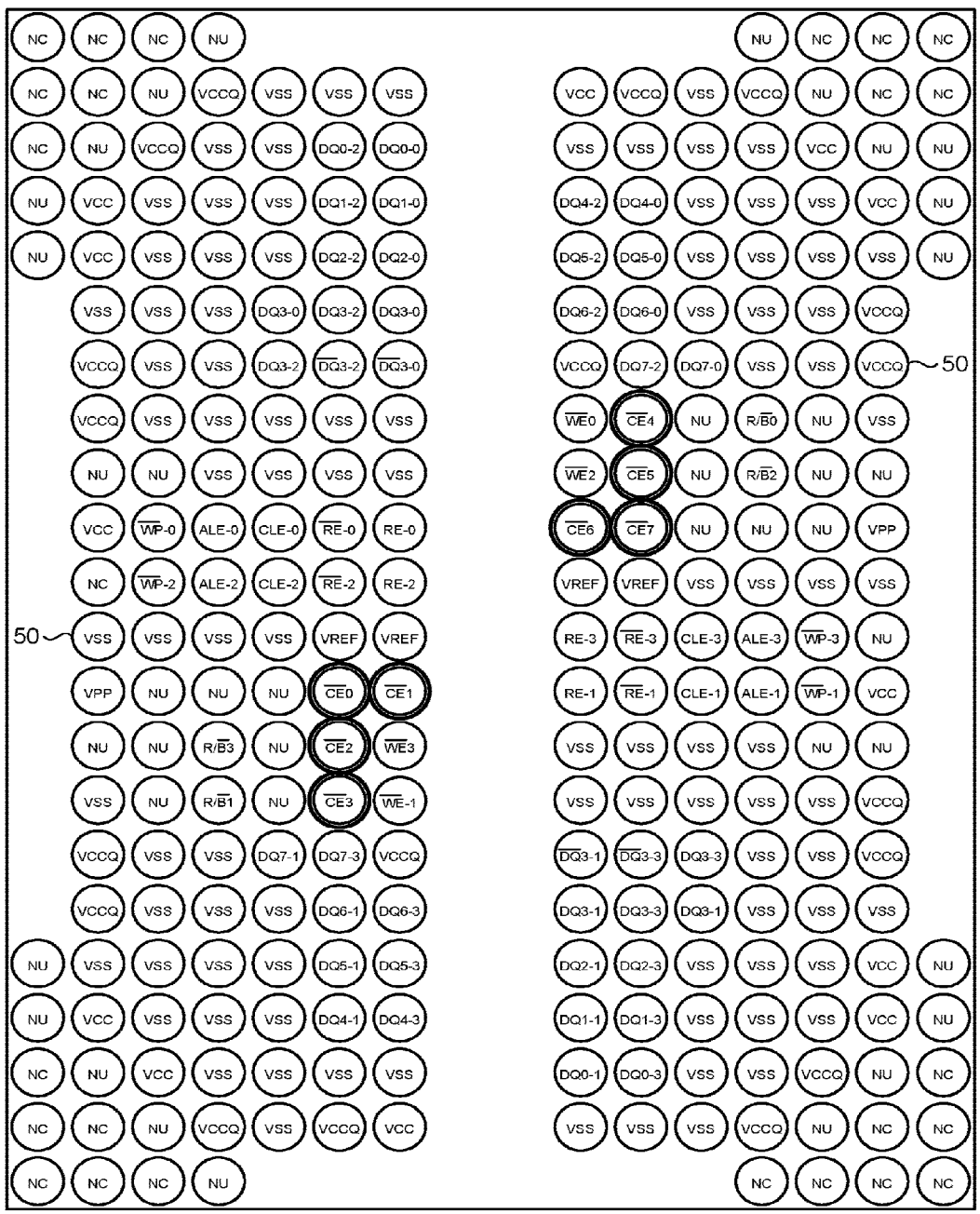
FIG. 16 is a plan view of an arrangement of solder balls of the memory package.

FIG. 14 is a cross-sectional view of an internal configuration example of the memory package 15 shown in FIG. 2. FIG. 15 is a perspective view of an internal configuration example of a part of the memory package 15. FIG. 16 is a plan view of a back surface of the memory package 15. As shown in FIG. 14, the semiconductor package 15 according to the first embodiment is constituted by a wiring substrate 7, sixteen memory chips #0 to #15 stacked on the wiring substrate 7, a bonding wire 9, a resin sealing material 8 that performs resin sealing of the memory chips #0 to #15 and the bonding wire 9, and a solder ball 50 formed to be arranged in a lattice on a back surface of the wiring substrate 7. According to the first embodiment, the memory chip #0 is incorporated in a first stack, the memory chip #2 is incorporated in a second stack, the memory chip #1 is incorporated in a third stack, the memory chip #3 is incorporated in a fourth stack, . . . , the memory chip #12 is incorporated in a thirteenth stack, the memory chip #14 is incorporated in a fourteenth stack, the memory chip #13 is incorporated in a fifteenth stack, and the memory chip #15 is incorporated in a sixteenth stack.

The solder balls 15 are input/output pins of the memory package 15, and as shown in FIG. 16, these input/output pins include CE pins (CE0 to CE7) of the memory package 15. Eight CE pins CE0 to CE7 of the memory package 15 are represented by a double circle. In FIG. 16, 272 input/output pins including eight CE pins CE0 to CE7 shown in FIG. 2 are laid out. In FIG. 16, Vcc denotes a power supply potential pin, Vss denotes a ground potential pin, NU denotes an unused pin, and NC denotes an unconnected pin.

The bonding wire 9 electrically connects a chip pad 26 on an end side part of each of the stacked memory chips #0 to #15 to a bonding pad 27 on an end side part of the wiring substrate 7. The chip pad 26 is an input/output pin of the memory chips. The bonding pad 27 is electrically connected to the solder balls 50 by wiring patterns formed on front and back surfaces of the wiring substrate 7. The wiring patterns formed on the front and back surfaces are connected to each other by a through-hole 23.

In FIG. 2, it is assumed that one CE pin of the memory package 15 is electrically connected to CE pins of two memory chips by the internal wire 5 in the memory package 15. FIG. 15 is an example of mounting wiring that constitutes the internal wire 5. A chip pad 26CE serving as a CE pin of the memory chip #0 of the first stack and a chip pad 26CE serving as a CE pin of the memory chip #1 of the third stack are electrically connected to an identical bonding pad 27CE by the bonding wire 9. This bonding pad 27CE is connected via the wiring patterns of the wiring substrate 7 and the through-hole 23 to the CE pin CE0 of the memory package 15 shown in FIG. 16. With similar wiring connection, eight CE pins CE0 to CE7 of the memory package 15 are connected to CE pins of sixteen memory chips.

The internal wire 5 can be constituted by forming the wiring pattern of the wiring substrate 7 so that the chip pad 26CE serving as a CE pin of a memory chip is connected to the bonding pad 27 at a ratio of 1:1 and the solder balls 50 serving as CE pins are connected to the bonding pad 27 at a ratio of n:1.

As explained above, in the first embodiment, effective bits of a LUN and a chip address are selected based on an MCM value and whether its own memory chip is accessible can be determined based on comparison of the selected effective bit of the LUN and the selected effective bit of the chip address. Therefore, even in a case of different MCMs, setting of a LUN of each memory chip in a memory package can be used commonly, so that the number of product lineups can be reduced and this contributes to the cost reduction. Furthermore, at the time of manufacturing a memory system after an MCM value is registered and set, mounting can be changed so that the number of chip enable wires is reduced. An operation of changing setting at the time of the change in mounting suffices only for a change in the MCM value, and thus it is possible to change mounting easily and efficiently.

(Second Embodiment)

In a second embodiment, every time the power supply of the memory system 100 is turned on, a control sequence of the controller 20 is changed so as to reset a set value of the MCM register 140a.

Figure 17:
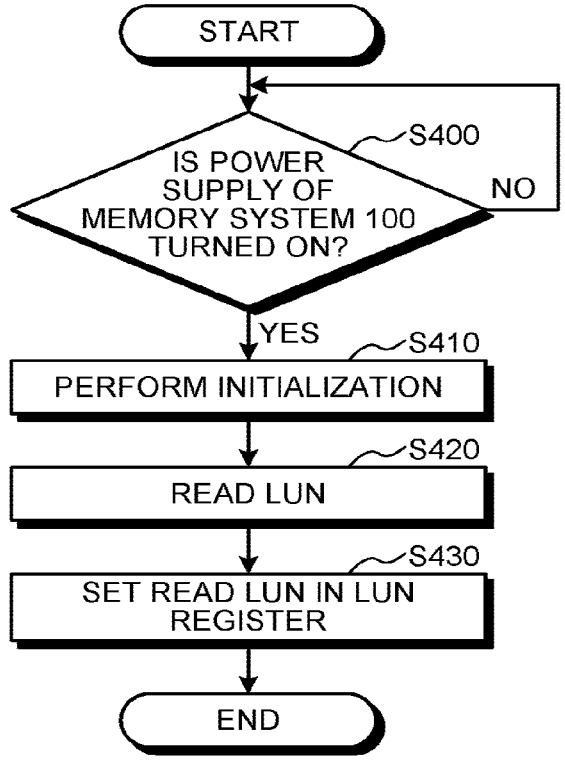

An internal configuration of each of the memory chips #0 to #15 according to the second embodiment is identical to that shown in FIG. 3. FIG. 17 is a flowchart of an operation example of each of the memory chips #0 to #15 when the power supply of the memory system 100 according to the second embodiment is turned on. When the control unit 112 of each of the memory chips #0 to #15 detects that the power supply is turned on (Step S400), the control unit 112 performs an initialization process (Step S410). The control unit 112 of each of the memory chips #0 to #15 reads the LUN 145 stored in the ROM area 135 (Step S420) and stores the read LUN 145 in the LUN register 145a within the control unit 112 (Step S430). As a result, in the respective memory chips #0 to #15, the LUN 145 stored in the ROM area 135 is set in the LUN register 145a. According to the second embodiment, when the power supply is turned on, only the LUN 145 is thus set in the LUN register 145a and an MCM is not set in the MCM register 140a.

Figure 18:
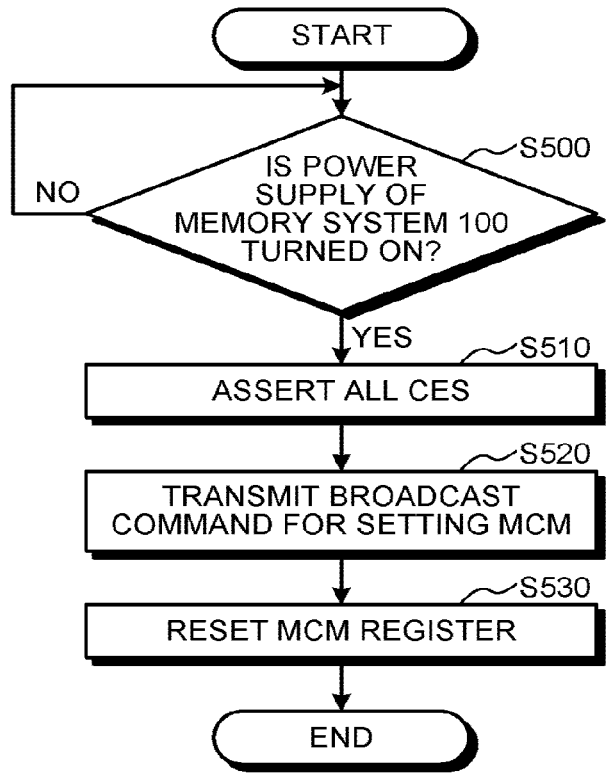

FIG. 18 illustrates an operation procedure of the controller 20 when the power supply of the memory system 100 is turned on. When the controller 20 detects that the power supply is turned on (Step S500), the controller 20 performs an initialization sequence that includes the following processes. First, the controller 20 asserts all CE pins thereof (Step S510) and outputs a broadcast command for setting an MCM to an arbitrary value to the NAND 10 (Step S530). With this broadcast command, the MCM registers 140a within all the memory chips #0 to #15 in the NAND 10 can be set to an arbitrary value at the same time (Step S530).

Figure 19:
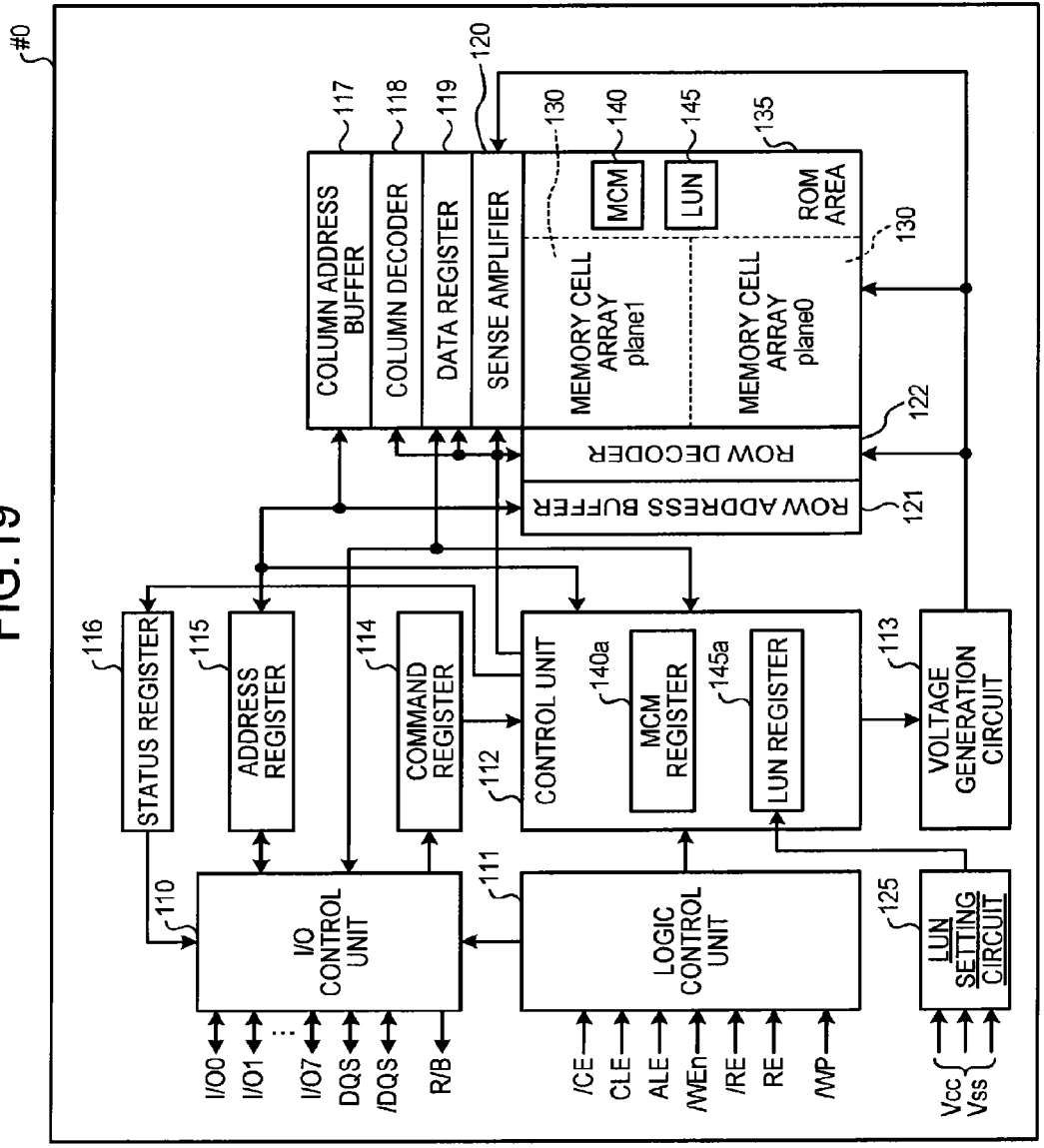
FIG. 19 is a block diagram of a circuit configuration example of the memory chip according to the second embodiment.

In the second embodiment, the memory chips #0 to #15 that have an internal configuration shown in FIG. 19 can be used. In FIG. 19, a LUN setting circuit 125 that sets a LUN value in a fixed manner in terms of hardware in a mode of connecting to the power supply voltage Vss and the ground voltage Vcc is built in the memory chips, and a register value of the LUN register 145a is set by a set value of the LUN setting circuit 125. In this case, a process of reading the LUN 145 stored in the ROM area 135 and storing the LUN 145 in the LUN register 145a when the power supply is turned on is not performed.

According to a memory system of the second embodiment, when a manufacturer of the memory system 100 changes wiring of chip enables, it suffices that in addition to a practical wiring change operation, only a process of changing an initialization sequence for resetting an MCM register value is performed. As a result, it is possible to change mounting simply and efficiently.

(Third Embodiment)

In a third embodiment, an ID code is output depending on a change in an MCM. The NAND 10 has a basic function of outputting an ID code. In response to an ID code read request from the controller 20, each of the memory chips #0 to #15 outputs ID code information that includes a manufacturer, the number of planes, a power supply voltage value, and the like to the controller 20. This ID code information includes an information value that indicates a memory capacity per chip enable CE. This information value is called "capacity/CE information" below. According to the third embodiment, the capacity/CE information is output depending on a change in an MCM.

Figure 20:
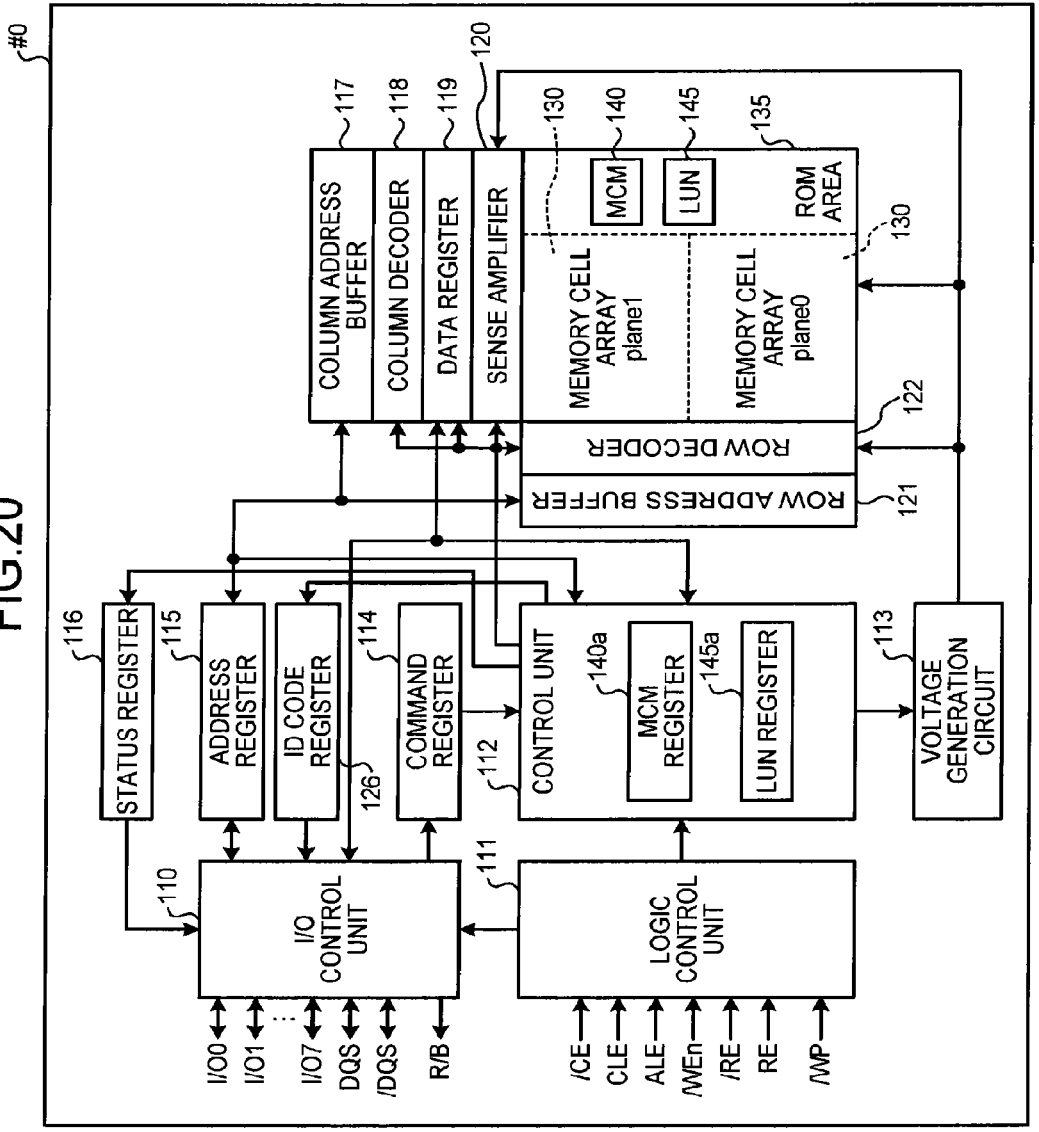
FIG. 20 is a block diagram of a circuit configuration example of a memory chip according to a third embodiment.

FIG. 20 illustrates an example of an internal configuration of each of the memory chips #0 to #15 according to the third embodiment. In FIG. 20, an ID code register 126 is added. An ID code output from the control unit 112 is temporarily stored in the ID code register 126 and then output via the I/O control unit 110 to the controller 20.

Figure 21:
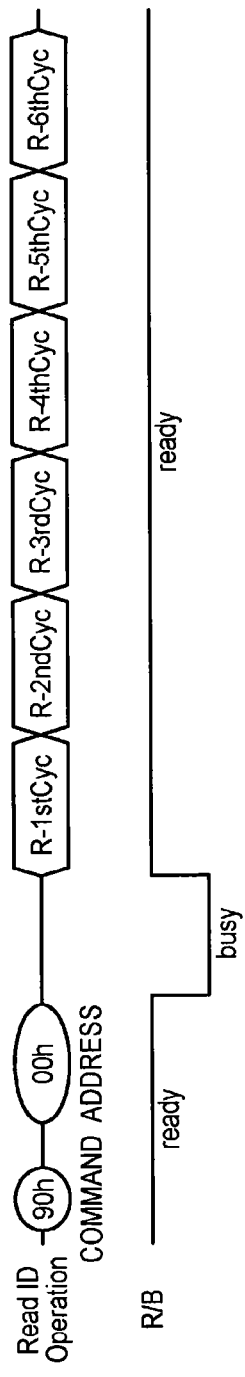
FIG. 21 is a time chart of an example of a read ID operation.

FIG. 21 illustrates an example of a time chart at the time of a read ID operation. The controller 20 first outputs a read ID code command (90h), and then outputs an address signal (00h) to an I/O signal line. The control unit 112 of each of memory chips that receives these read ID code command and address signal temporarily stores plural pieces of ID code information that include a manufacturer, the number of planes, a power supply voltage value, capacity/CE information, and the like in the ID code register 126. The I/O control unit 110 outputs these pieces of ID code information to the controller 20 in plural cycles.

Figure 22:
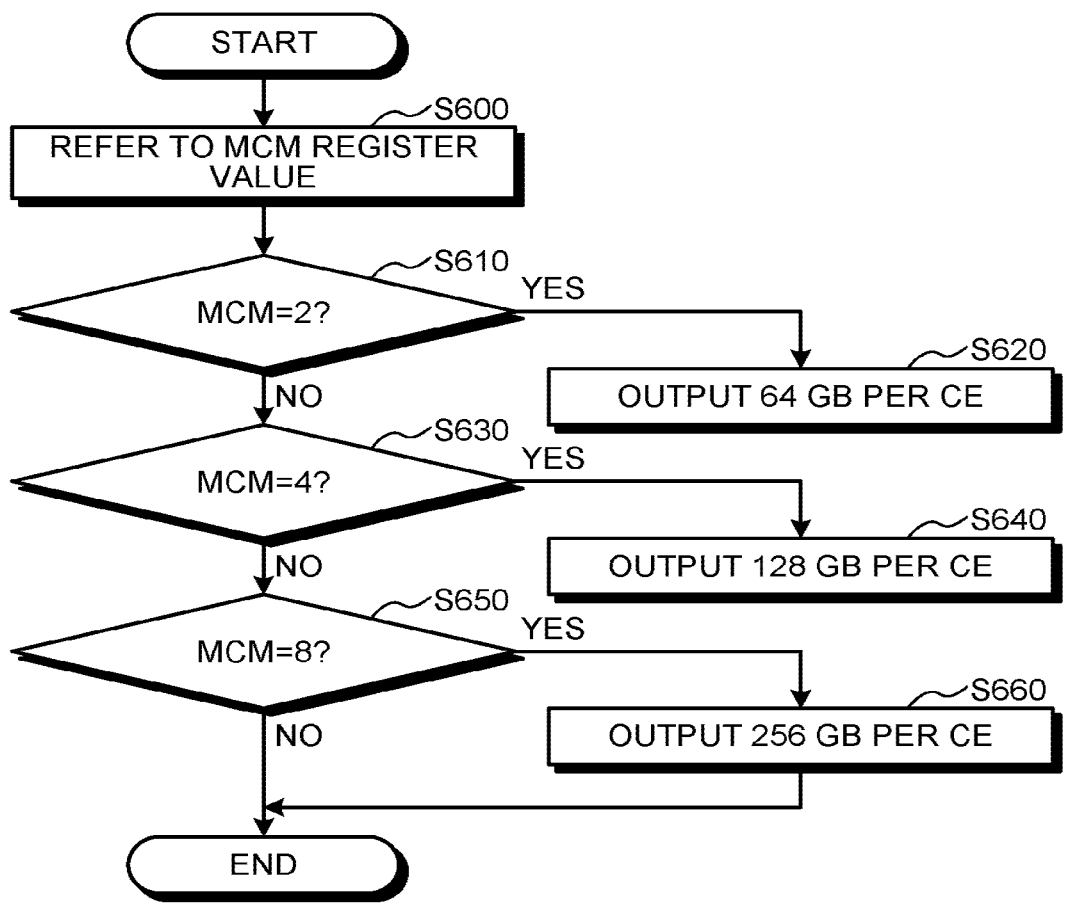
FIG. 22 is a flowchart of an operation of a control unit at the time of the read ID operation.

FIG. 22 is a flowchart of an operation example of the control unit 112 at the time of receiving a read ID code command. A logic in which different capacity/CE values are output corresponding to a plurality of different MCM values is incorporated in the control unit 112. When the control unit 112 receives the read ID code command, the control unit 112 refers to an MCM value stored in the MCM register 140a (Step S600). In a case of a memory package that includes sixteen memory chips each of which has a storage capacity of 32 Gb, when the referred MCM value is 2 (Step S610), the control unit 112 outputs a capacity/CE value (for example, DFh) that indicates that a storage capacity value per chip enable is, for example, 64 Gb (Step S620), when the MCM value is 4 (Step S630), the control unit 112 outputs a capacity/CE value (for example, 3 Ah) that indicates that the storage capacity value is, for example, 128 Gb (Step S640), and when the MCM value is 8 (Step S650), the control unit 112 outputs a capacity/CE value (for example, 3Ch) that indicates the storage capacity value is, for example, 256 Gb (Step S660). The control unit 112 outputs these capacity/CE values to the ID code register 126 as, for example, ID code information in a second cycle. As a result, a capacity/CE value that corresponds to the MCM value is output to the controller 20 together with other ID code information.

As explained above, in the third embodiment, when the ID code read request is input from the controller 20, the control unit 112 refers to the MCM register 140a and outputs a capacity/CE value that corresponds to an MCM value set in the MCM register 140a. As a result, even when the MCM value is changed, a capacity/CE value corresponding to the changed MCM value can be output to the controller 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a memory package including a plurality of memory chips, each of the memory chips including a non-volatile memory cell array; and
   a controller configured to select one memory chip from the memory package based on a chip enable and a chip address, wherein
   each of the memory chips includes
   a first storage unit configured to store therein first information that is n-bit information (n is an integer of 2 or more) compared to the chip address, the first information being used for identifying its own memory chip,
   a second storage unit configured to store therein second information for determining an effective bit of the n-bit first information, and
   a control unit configured to determine an effective bit of the n-bit first information and an effective bit of the chip address based on the second information.

2. The memory system according to claim 1, wherein the first information has a bit number capable of identifying the plurality of memory chips up to a predetermined number of memory chips.

3. The memory system according to claim 1, wherein at a time of start-up, the control unit is configured to read the first and second information stored in a memory cell array area of each memory chip to store the first and second information into the first and second storage units.

4. The memory system according to claim 1, wherein at a time of start-up, the controller is configured to transmit a command for setting the second information in the second storage unit to the memory package.

5. The memory system according to claim 4, wherein the command is a broadcast command and is transmitted to the memory chips within the memory package at a same time.

6. The memory system according to claim 1, wherein when the control unit outputs a value of third information that indicates a storage capacity per chip enable to the controller, the control unit is configured to output a different value of the third information corresponding to a plurality of different values of the second information.

7. The memory system according to claim 1, wherein the control unit, when the effective bit of the n-bit first information is identical with the effective bit of the chip address and when the chip enable is asserted, determines that own memory chip is selected.

8. A memory package including a plurality of memory chips, each of the memory chips including a non-volatile memory cell array, wherein
each of the memory chips includes
a first storage unit configured to store therein first information that is n-bit information (n is an integer of 2 or more) compared to the chip address, the first information being used for identifying its own memory chip,
a second storage unit configured to store therein second information for determining an effective bit of the n-bit first information, and
a control unit configured to determine an effective bit of the n-bit first information and an effective bit of the chip address based on the second information.

9. The memory package according to claim 8, wherein the control unit, when the effective bit of the n-bit first information is identical with the effective bit of the chip address and when the chip enable is asserted, determines that own memory chip is selected.

10. The memory package according to claim 8, wherein the first information has a bit number capable of identifying the plurality of memory chips up to a predetermined number of memory chips.

11. The memory package according to claim 8, wherein at a time of start-up, the control unit is configured to read the first and second information stored in a memory cell array area of each memory chip to store the first and second information into the first and second storage units.

12. The memory package according to claim 8, wherein when the control unit outputs a value of third information that indicates a storage capacity per chip enable to a controller, the control unit is configured to output a different value of the third information corresponding to a plurality of different values of the second information.

13. An assembling method of a memory system that assembles a memory package and a controller, the memory package including a plurality of memory chips, each of the memory chips including a non-volatile memory cell array, the controller selecting one memory chip from the memory package based on a chip enable and a chip address, the assembling method comprising:
changing of second information that is stored in the non-volatile memory cell array, the second information being used for determining an effective bit of n-bit first information (n is an integer of 2 or more), the n-bit first information being a comparison target of the chip address; and
connecting a chip enable pin of the controller to a chip enable pin of the memory package by wires corresponding to the changing of the second information.

14. The assembling method according to claim 13, further comprising:
not changing the first information, when the second information being changed.

* * * * *